(12) United States Patent
Muhammad et al.

(10) Patent No.: US 8,494,468 B1
(45) Date of Patent: Jul. 23, 2013

(54) MOBILE WIRELESS COMMUNICATIONS DEVICE INCLUDING SENSING TRANSISTOR AND HYSTERETIC COMPARATOR AND RELATED METHODS

(75) Inventors: Khurram Muhammad, Garland, TX (US); Seong-Ryong Ryu, Richardson, TX (US)

(73) Assignee: Research In Motion Limited, Waterloo, Ontario (CA)

( * ) Notice: Subject to any disclaimer, the term of this patent is extended or adjusted under 35 U.S.C. 154(b) by 36 days.

(21) Appl. No.: 13/360,414

(22) Filed: Jan. 27, 2012

(51) Int. Cl.
*H04B 1/16* (2006.01)

(52) U.S. Cl.
USPC .......................... 455/195.1; 455/108; 330/136

(58) Field of Classification Search
USPC ................................ 455/195.1, 108; 330/136
See application file for complete search history.

(56) References Cited

U.S. PATENT DOCUMENTS

| | | | |
|---|---|---|---|
| 5,077,540 A | 12/1991 | Keith et al. | |
| 5,507,023 A * | 4/1996 | Suganuma et al. | 455/234.1 |
| 5,742,151 A * | 4/1998 | Hwang | 323/222 |
| 5,818,207 A | 10/1998 | Hwang | |
| 6,397,090 B1 | 5/2002 | Cho | |
| 7,782,154 B2 | 8/2010 | Hou et al. | |
| 7,808,323 B2 | 10/2010 | Takinami et al. | |
| 8,098,062 B2 * | 1/2012 | Kilian | 324/207.2 |
| 8,237,499 B2 * | 8/2012 | Chen et al. | 330/136 |
| 8,284,581 B2 * | 10/2012 | Ivanov | 363/127 |
| 2005/0162207 A1 * | 7/2005 | Kamei | 327/205 |
| 2008/0067993 A1 | 3/2008 | Coleman | |
| 2011/0084752 A1 * | 4/2011 | Julstrom et al. | 327/336 |
| 2012/0188024 A1 * | 7/2012 | Yamanouchi | 332/108 |

* cited by examiner

*Primary Examiner* — Creighton Smith
(74) *Attorney, Agent, or Firm* — Allen, Dyer, Doppelt, Milbrath & Gilchrist, P.A.

(57) ABSTRACT

A mobile wireless communications device may include a portable housing, and a supply modulator carried by the portable housing. The supply modulator may include an output node, a linear amplifier coupled to the output node, and a switching amplifier also coupled to the output node. The switching amplifier may include at least one sensing transistor configured to sense current output from the linear amplifier and generate a drive voltage, and a hysteretic comparator coupled to the at least one sensing transistor and configured to be driven by the drive voltage. The mobile wireless communications device may also include a radio frequency (RF) power amplifier coupled to the output node of the supply modulator, and a wireless transceiver carried by the portable housing and coupled to the RF power amplifier.

18 Claims, 5 Drawing Sheets

MOBILE WIRELESS COMMUNICATIONS DEVICE INCLUDING SENSING TRANSISTOR AND HYSTERETIC COMPARATOR AND RELATED METHODS

TECHNICAL FIELD

The present disclosure generally relates to the field of wireless communications systems, and, more particularly, to mobile wireless communications devices and related methods.

BACKGROUND

Mobile wireless communications systems continue to grow in popularity and have become an integral part of both personal and business communications. For example, cellular telephones allow users to place and receive voice calls almost anywhere they travel, while tablet personal computers allow mobile data communications almost anywhere. Moreover, as mobile communications technology, for example, cellular communications technology, has increased, so too has the functionality of cellular devices and the different types of devices available to users. For example, many cellular devices now incorporate personal digital assistant (PDA) features such as calendars, address books, task lists, etc. Moreover, such multi-function devices, including, for example, tablet personal computers, may also allow users to wirelessly send and receive electronic mail (email) messages and access the Internet via a cellular network and/or a wireless local area network (WLAN), for example.

Even so, as the functionality of cellular communications devices continues to increase, so too does the demand for smaller devices which are easier and more convenient for users to carry. One challenge this poses for cellular device manufacturers is designing communications circuitry, including, for example, an RF transmitter, for increased operational and performance stability within the relatively limited amount of space available for the communications circuitry.

DETAILED DESCRIPTION

The present description is made with reference to the accompanying drawings, in which various embodiments are shown. However, many different embodiments may be used, and thus the description should not be construed as limited to the embodiments set forth herein. Rather, these embodiments are provided so that this disclosure will be thorough and complete. Like numbers refer to like elements throughout.

In accordance with an exemplary aspect, a mobile wireless communications device may include a portable housing, and a supply modulator carried by the portable housing. The supply modulator may include an output node, a linear amplifier coupled to the output node, and a switching amplifier also coupled to the output node, for example. The switching amplifier may include at least one sensing transistor configured to sense current output from the linear amplifier and generate a drive voltage, and a hysteretic comparator coupled to the at least one sensing transistor and configured to be driven by the drive voltage. The mobile wireless communications device may also include a radio frequency (RF) power amplifier coupled to the output node of the supply modulator, and a wireless transceiver carried by the portable housing and coupled to the RF power amplifier, for example.

The switching amplifier may further include at least one current conveyor circuit coupled to the at least one sensing transistor. The at least one current conveyor circuit may be configured to control a bias of the at least one sensing transistor. The linear amplifier may include an operational transconductance amplifier and at least one transistor coupled thereto, for example.

The switching amplifier may further include a buffer coupled between the hysteretic comparator and the output node. The buffer may include a pair of transistors having respective control terminals coupled to each other.

The switching amplifier may further include at least one inductor coupled between the output node and the buffer. The wireless transceiver may include a cellular transceiver, for example.

A method aspect is directed to a method of operating a supply modulator for a power amplifier of a mobile wireless communications device. The supply modulator may include an output node, a linear amplifier coupled to the output node, and a switching amplifier coupled to the linear amplifier. The method may include using the switching amplifier to sense current output from the linear amplifier via at least one sensing transistor and generate a drive voltage via the at least one sensing transistor, and drive a hysteretic comparator coupled to the at least one sensing transistor with the drive voltage.

Figure 1:
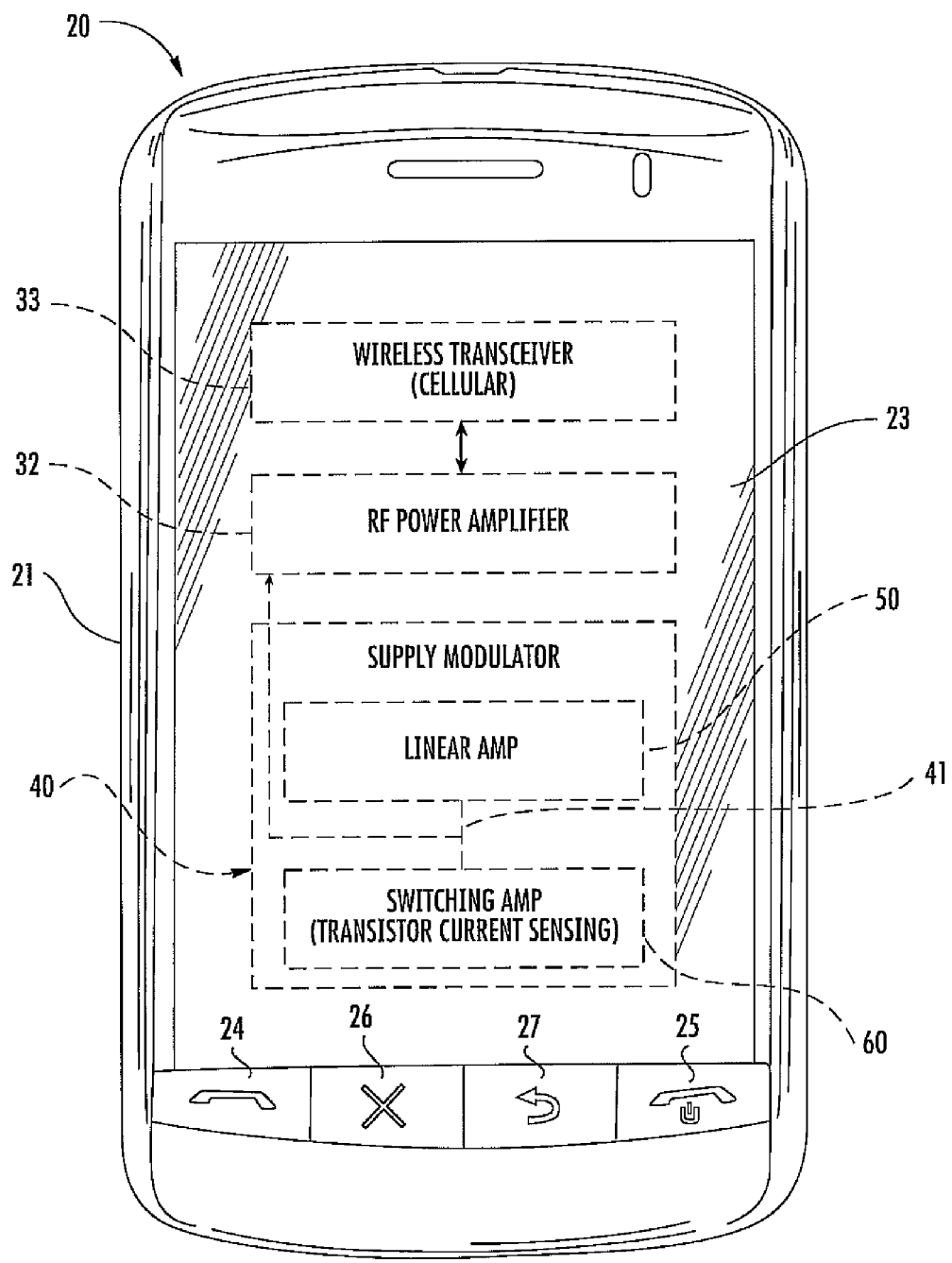
FIG. 1 is a perspective view of a mobile wireless communications device including a supply modulator in accordance with one exemplary aspect.
Figure 2:
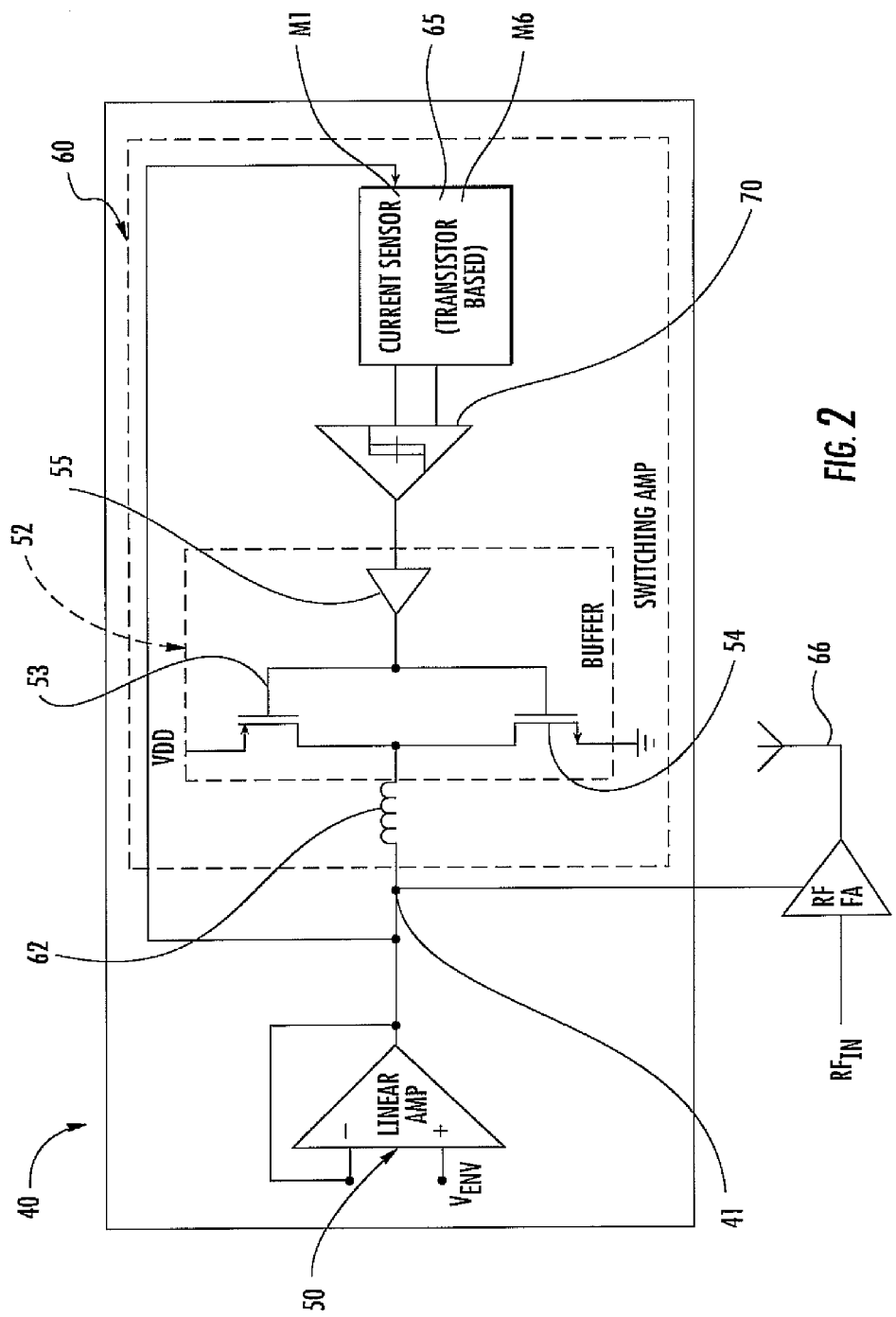
FIG. 2 is a schematic block diagram of a portion of the mobile wireless communications device of FIG. 1 including the supply modulator.

Referring initially to FIGS. 1-2, a mobile wireless communications device 20, which may be, for example, a cellular communications device, illustratively includes a portable housing 21. A printed circuit board (PCB) may be carried by the portable housing. In some embodiments, the PCB may be replaced by or used in conjunction with a metal chassis or other substrate. The PCB may also include a conductive layer defining a ground plane.

The exemplary mobile wireless communications device 20 further illustratively includes a display 23 and a plurality of control keys including an "off hook" (i.e., initiate phone call) key 24, an "on hook" (i.e., discontinue phone call) key 25, a menu key 26, and a return or escape key 27. Operation of the various device components and input keys, etc., will be described further below with reference to FIG. 5.

The mobile wireless communications device 20 further illustratively includes a radio frequency (RF) power amplifier (PA) 32. An antenna 66 is coupled between an output of the RF power amplifier 32. A wireless transceiver 33 is carried by the portable housing and coupled to the RF power amplifier 32. The wireless transceiver 33 may be a cellular transceiver, for example. Of course, the wireless transceiver 33 may be another type of transceiver.

The mobile wireless communications device 20 also includes a supply modulator 40 carried by the portable housing 21. The supply modulator 40 may be configured to track an envelope of the RF power amplifier 32. The supply modulator may be considered a hybrid-supply modulator, as will be appreciated by those skilled in the art. The supply modulator 40 includes an output node 41 coupled to the RF power amplifier 32 and a linear amplifier (LA) 50 coupled to the output node. The linear amplifier 50 also includes an output stage, which will be described in further detail below.

The supply modulator 40 also includes a switching amplifier 60 also coupled to the output node 41. The supply modulator 40 advantageously provides a variable supply voltage to the RF power amplifier 32 to increase overall power efficiency.

The switching amplifier 60 includes a current sensor 65 that includes sensing transistors M1, M6 configured to sense current output from the linear amplifier 50 and generate a drive voltage. The switching amplifier 60 also includes a hysteretic comparator 70 coupled to the sensing transistors M1, M6. The hysteretic comparator 70 is configured to be driven by the drive voltage. An inductor 62 is coupled between a buffer 52 and the output node 41. In other words, the buffer 52 is coupled between the hysteretic comparator 70 and the inductor 62. The inductor 62 generates the current for the RF power amplifier 32. As will be discussed in further detail below, ideally the average output current of the linear amplifier 50 is supposed to be zero for maximum power efficiency. The buffer 52 generates pulses with variable duty ratio depending on the output current of the linear amplifier 50. For instance, if the output current of the linear amplifier 50 is less than zero, than the duty ratio becomes larger so that the inductor 62 stores and provides more current to decrease the output current of the linear amplifier.

Figure 3:
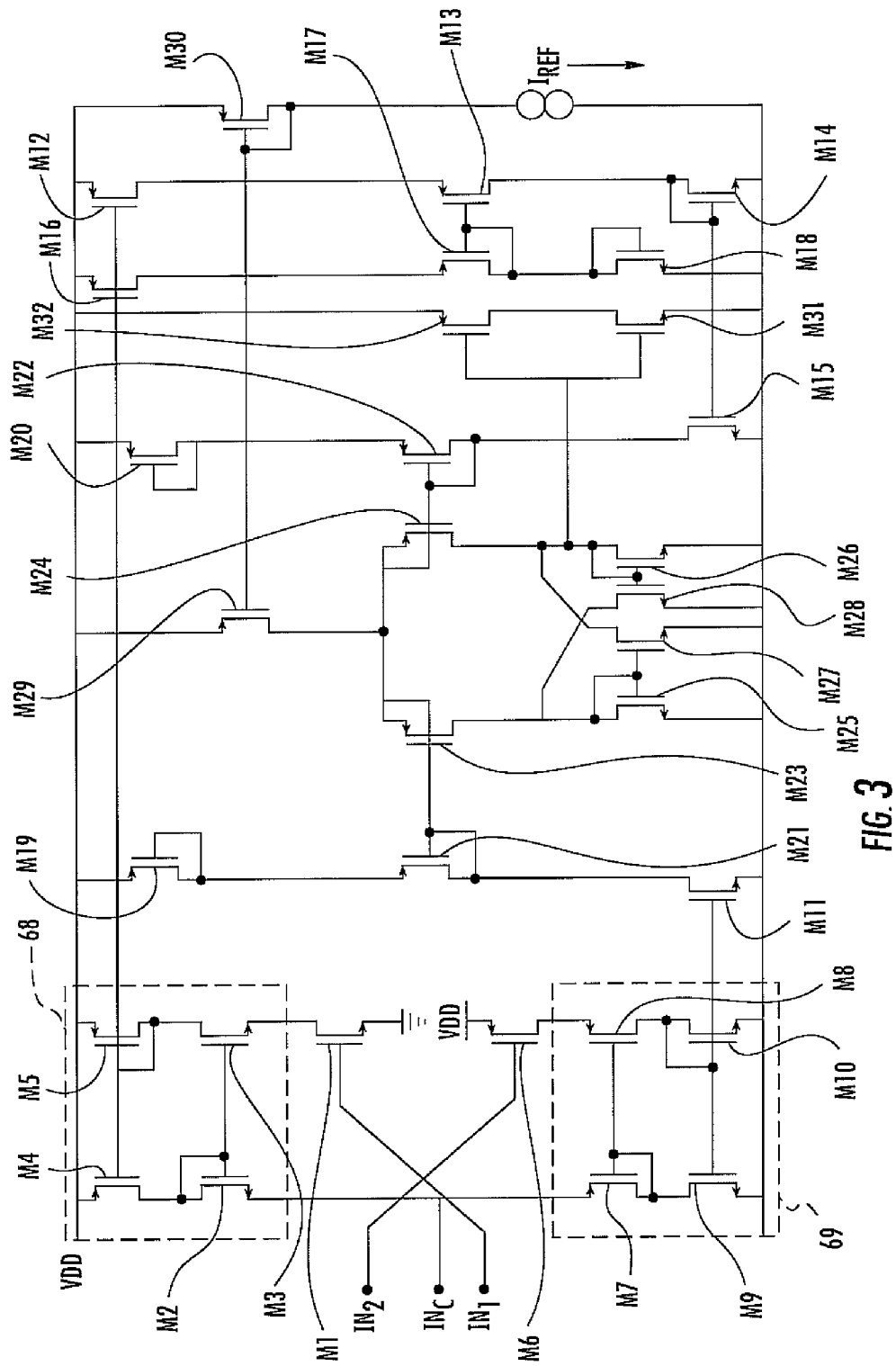
FIG. 3 is a schematic diagram of the current sensor and hysteretic comparator of FIG. 2.
Figure 4:
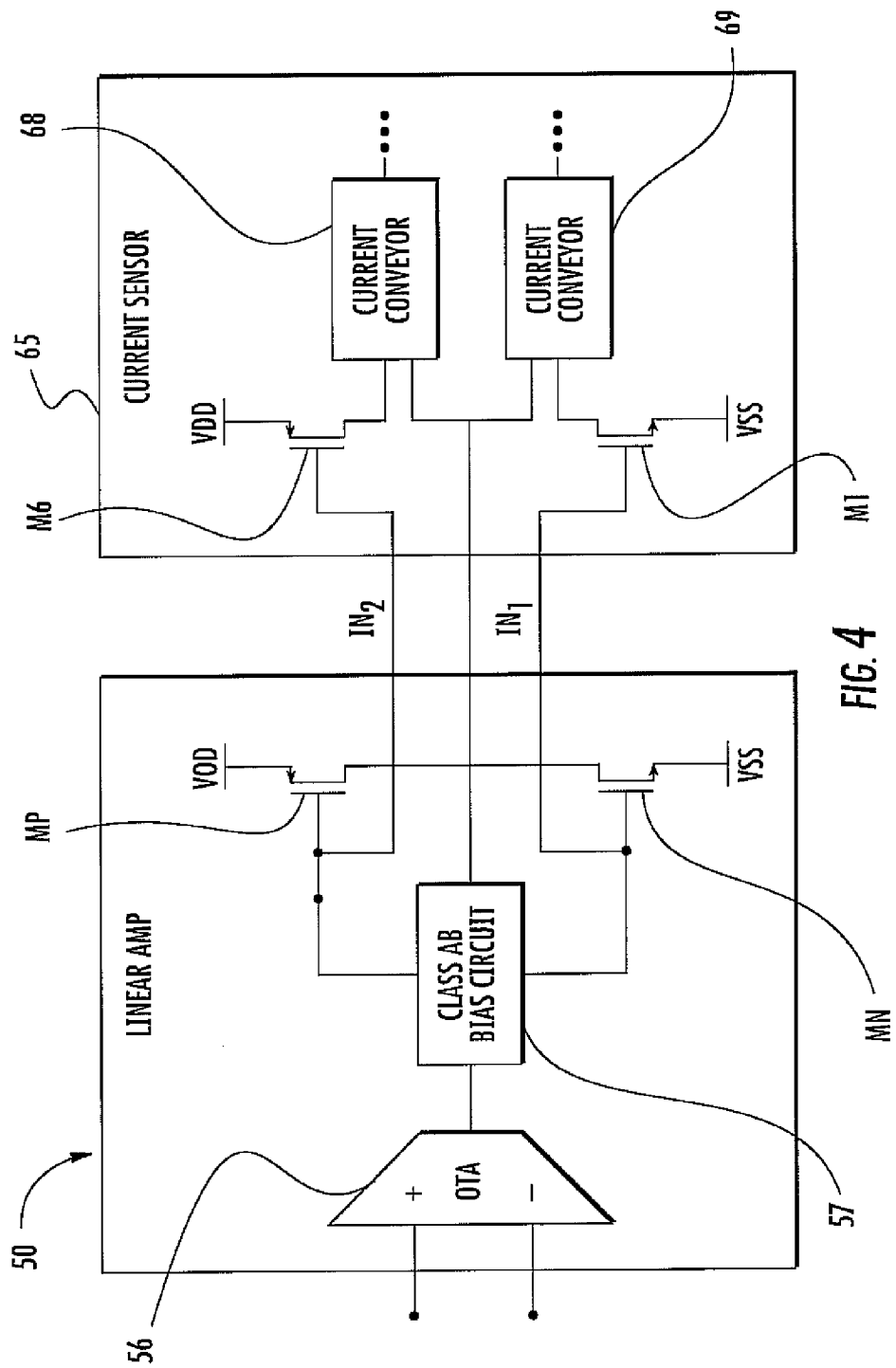
FIG. 4 is a schematic diagram of a system level connection of the linear amplifier and current sensor of FIG. 2.

Referring now additionally to FIGS. 3 and 4, the various components, and more particularly, the supply modulator 40 are described in further detail. In the supply modulator 40, the duty ratio of the switching amplifier 60 is dynamically adjusted to set the output current of the linear amplifier 50 to zero and determined by the output current level of linear amplifier. For example, if output current of the linear amplifier 50 is greater than zero, then the duty ratio increases to reduce the output current of linear amplifier back to zero. In contrast, the duty ratio decreases to rise up the output current of the linear amplifier 50 when it is below zero.

As will be appreciated by those skilled in the art, an output current of zero from the linear amplifier 50 is highly desired. This is because the closer to zero the output current from the linear amplifier 50 is, the more efficiently the RF power amplifier 32 operates. In other words, if the output current of the linear amplifier 50 is zero, the RF power amplifier 32 operates at maximum efficiency, as will be appreciated by those skilled in the art.

To accomplish this functionality, the current sensor 65 senses the output current of linear amplifier 50 and then transforms the sensed current to a control voltage to drive the hysteretic comparator 70, which in turn generates a rail-to-rail control signal to the buffer 52 coupled between the hysteretic comparator and the output node 41. The buffer 52 includes a pair of transistors 53, 54, and more particularly, power amplifiers, having respective control terminals coupled to each other. An inverter chain 55 and more particularly, an output of the inverter chain is also coupled to the control terminals of the pair of power transistors 53, 54. The input of the inverter chain 55 is coupled to the output of the hysteretic comparator 70. Thus, an increased accuracy, quicker, and more power efficient current sensor may be desired for relatively highly efficient operation.

One prior art method of sensing the output current of the linear amplifier 50 includes inserting a resistor in series with the output of the linear amplifier to monitor the output current of the linear amplifier by measuring the voltage across the resistor. Though this method may be implemented relatively easily, the resistor may cause additional power consumption, which decreases power efficiency. This may be particularly important in a mobile wireless communications device, for example.

Advantageously, as in the present embodiments, the output current of the linear amplifier 50 may be sensed by measuring the current difference between the output stage transistors MN, MP, which are in the form of NMOS and PMOS transistors, respectively. In other words, the current sensing is done without a sensing resistor. It should be noted that the output current of the linear amplifier 50 may be about equal to the current difference between the drain currents of the output stage transistors MN, MP. Scaled sensing NMOS and PMOS transistors M1, M6 are added, and their gate and source terminals are connected to the output stage NMOS and PMOS transistors MN, MP respectively. It is also worthy to note that typically, the sensing transistors M1, M6 have much shorter gate widths and, thus flow much lower current than the output stage transistors MN, MP. Due to the same voltage biases at their gate and source terminals, if the sensing transistors M1, M6 have the same drain voltage bias as the drain bias of the output transistors MN, MP, than a relatively accurately scaled copy of the output stage current may flow through the sensing transistors. Conventionally, a feedback loop formed by operational amplifiers may be employed for the drain bias control.

The output stage of the linear amplifier 50 also includes an operational transconductance amplifier (OTA) 56 configured to receive input voltage (FIG. 4). The output of the OTA 56 is coupled to a class AB bias circuit 57, which is coupled to the control terminals of the output stage transistors MN, MP. The functionality of the OTA 56 and the class AB bias circuit 57 will be appreciated by those skilled in the art.

In the present embodiments, instead of using operational amplifiers, the current sensor 65 also includes two current-conveyors 68, 69 to control the drain biases of the sensing transistors, M1 and M6. The current-conveyors 68, 69 are implemented by using eight MOS transistors M2-M5, M7-M10, and together have several advantages over operational amplifiers, as will be appreciated by those skilled in the art. First, the current conveyors 68, 69 may use a less number of the transistors meaning that its implementation may be simpler. Secondly, the current conveyors 68, 69 may have a wider bandwidth than operational amplifiers. Thus, the cost, frequency response, and power efficiency may be improved. Other configurations may be implemented, for example, by using a different number and/or different type of transistors in a different arrangement.

Assuming the transistors are in the saturation region, the voltages at INC, and nodes between M6 and M8, and M3 and M1 may be identical or close to identical due to two feedback loops formed by four current mirrors, which are formed by M2 and M3, M4 and M5, M7 and M8, and M9 and M10. Moreover, since gate and source terminals of MN and M1, and MP and M6 are coupled to each other, then M1 and M6 may flow the scaled copy of the drain current of MN and MP, respectively, due to their same gate-to-source and drain-to-source voltage bias condition. The copied currents by M1 and M6 are in turn mirrored by transistors, M11-M18, and then converted to the differential voltage signal through transistors, M19-M22, where M16, M17 and M18 are to bias the current buffer transistor M13, and the current buffer may decrease the current error between M5 and M12 caused by bias mismatching. The differential voltage signal is applied to the inputs of the hysteretic comparator 70, which is implemented by ten transistors, M23-M32, and has relatively the same topology as a conventional hysteretic comparator. Lastly, the hysteretic comparator 70 generates the rail-to-rail control signal to drive the buffer 52.

One potential drawback of the embodiments described herein is that when the output voltage level of the linear amplifier 50 is relatively close to the supply voltage level (VDD or VSS), one of the current conveyors 68, 69 may underperform since M4 or M9 may fall into the linear region due to its limited voltage headroom, hence decreasing, by a relatively small margin, the sensing accuracy. However, the sensitivity of the current sensor 65 may be most critical at the average output signal level of the linear amplifier 50, which is equal to the average envelope signal level and close to the middle of the supply level, (VDD+VSS)/2. Thus, the power efficiency may not be degraded due to the sensitivity reduction.

A method aspect is directed to a method of operating a supply modulator 40 for a power amplifier 32 of a mobile wireless communications device 20. The supply modulator 40 includes an output node 41, a linear amplifier 50 coupled to the output node, and a switching amplifier 60 coupled to the linear amplifier. The method includes using the switching amplifier 60 to sense current output from the linear amplifier 50 via at sensing transistors M1, M6. The method also includes using the switching amplifier 60 to generate a drive voltage via the sensing transistors M1, M6, and drive a hysteretic comparator 70 coupled to the sensing transistors with the drive voltage.

Example components of a mobile wireless communications device 1000 that may be used in accordance with the above-described embodiments are further described below with reference to FIG. 5. The device 1000 illustratively includes a housing 1200, a keyboard or keypad 1400 and an output device 1600. The output device shown is a display 1600, which may comprise a full graphic LCD. Other types of output devices may alternatively be utilized. A processing device 1800 is contained within the housing 1200 and is coupled between the keypad 1400 and the display 1600. The processing device 1800 controls the operation of the display 1600, as well as the overall operation of the mobile device 1000, in response to actuation of keys on the keypad 1400.

The housing 1200 may be elongated vertically, or may take on other sizes and shapes (including clamshell housing structures). The keypad may include a mode selection key, or other hardware or software for switching between text entry and telephony entry.

Figure 5:
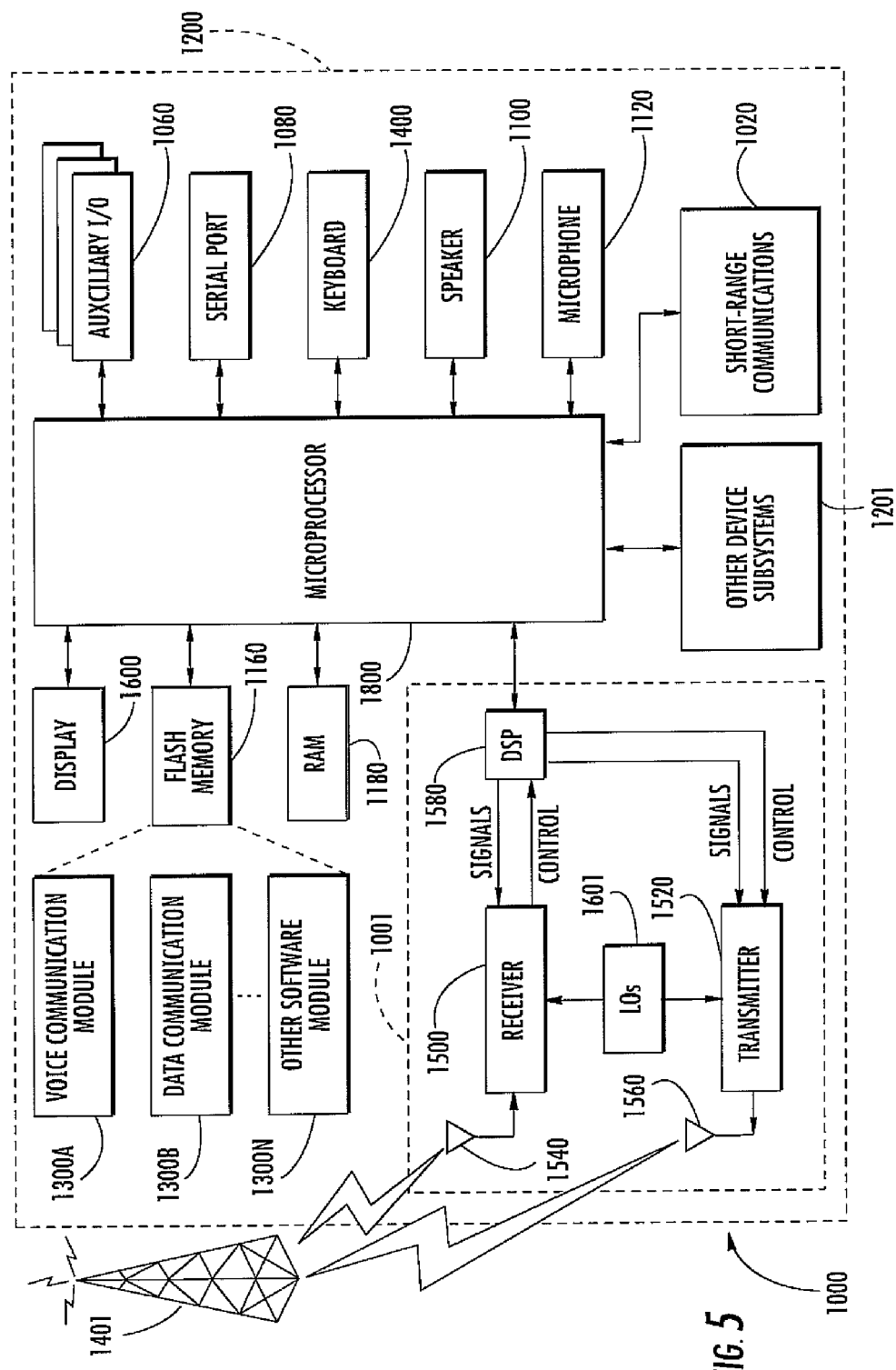
FIG. 5 is a schematic block diagram illustrating additional components that may be included in the electronic device of FIG. 1.

In addition to the processing device 1800, other parts of the mobile device 1000 are shown schematically in FIG. 5. These include a communications subsystem 1001; a short-range communications subsystem 1020; the keypad 1400 and the display 1600, along with other input/output devices 1060, 1080, 1100 and 1120; as well as memory devices 1160, 1180 and various other device subsystems 1201. The mobile device 1000 may comprise a two-way RF communications device having data and, optionally, voice communications capabilities. In addition, the mobile device 1000 may have the capability to communicate with other computer systems via the Internet.

Operating system software executed by the processing device 1800 is stored in a persistent store, such as the flash memory 1160, but may be stored in other types of memory devices, such as a read only memory (ROM) or similar storage element. In addition, system software, specific device applications, or parts thereof, may be temporarily loaded into a volatile store, such as the random access memory (RAM) 1180. Communications signals received by the mobile device may also be stored in the RAM 1180.

The processing device 1800, in addition to its operating system functions, enables execution of software applications 1300A-1300N on the device 1000. A predetermined set of applications that control basic device operations, such as data and voice communications 1300A and 1300B, may be installed on the device 1000 during manufacture. In addition, a personal information manager (PIM) application may be installed during manufacture. The PIM may be capable of organizing and managing data items, such as e-mail, calendar events, voice mails, appointments, and task items. The PIM application may also be capable of sending and receiving data items via a wireless network 1401. The PIM data items may be seamlessly integrated, synchronized and updated via the wireless network 1401 with corresponding data items stored or associated with a host computer system.

Communication functions, including data and voice communications, are performed through the communications subsystem 1001, and possibly through the short-range communications subsystem. The communications subsystem 1001 includes a receiver 1500, a transmitter 1520, and one or more antennas 1540 and 1560. In addition, the communications subsystem 1001 also includes a processing module, such as a digital signal processor (DSP) 1580, and local oscillators (LOs) 1601. The specific design and implementation of the communications subsystem 1001 is dependent upon the communications network in which the mobile device 1000 is intended to operate. For example, a mobile device 1000 may include a communications subsystem 1001 designed to operate with the Mobitex™, Data TAC™ or General Packet Radio Service (GPRS) mobile data communications networks, and also designed to operate with any of a variety of voice communications networks, such as AMPS, TDMA, CDMA, WCDMA, PCS, GSM, EDGE, etc. Other types of data and voice networks, both separate and integrated, may also be utilized with the mobile device 1000. The mobile device 1000 may also be compliant with other communications standards such as 3GSM, 3GPP, UMTS, 4G, etc.

Network access requirements vary depending upon the type of communication system. For example, in the Mobitex and DataTAC networks, mobile devices are registered on the network using a unique personal identification number or PIN associated with each device. In GPRS networks, however, network access is associated with a subscriber or user of a device. A GPRS device therefore typically involves use of a subscriber identity module, commonly referred to as a SIM card, in order to operate on a GPRS network.

When required network registration or activation procedures have been completed, the mobile device 1000 may send and receive communications signals over the communication network 1401. Signals received from the communications network 1401 by the antenna 1540 are routed to the receiver 1500, which provides for signal amplification, frequency down conversion, filtering, channel selection, etc., and may also provide analog to digital conversion. Analog-to-digital conversion of the received signal allows the DSP 1580 to perform more complex communications functions, such as demodulation and decoding. In a similar manner, signals to be transmitted to the network 1401 are processed (e.g. modulated and encoded) by the DSP 1580 and are then provided to the transmitter 1520 for digital to analog conversion, frequency up conversion, filtering, amplification and transmission to the communication network 1401 (or networks) via the antenna 1560.

In addition to processing communications signals, the DSP 1580 provides for control of the receiver 1500 and the transmitter 1520. For example, gains applied to communications signals in the receiver 1500 and transmitter 1520 may be adaptively controlled through automatic gain control algorithms implemented in the DSP 1580.

In a data communications mode, a received signal, such as a text message or web page download, is processed by the communications subsystem 1001 and is input to the processing device 1800. The received signal is then further processed by the processing device 1800 for an output to the display 1600, or alternatively to some other auxiliary I/O device 1060. A device may also be used to compose data items, such as e-mail messages, using the keypad 1400 and/or some other auxiliary I/O device 1060, such as a touchpad, a rocker switch, a thumb-wheel, or some other type of input device. The composed data items may then be transmitted over the communications network 1401 via the communications subsystem 1001.

In a voice communications mode, overall operation of the device is substantially similar to the data communications mode, except that received signals are output to a speaker 1100, and signals for transmission are generated by a microphone 1120. Alternative voice or audio I/O subsystems, such as a voice message recording subsystem, may also be implemented on the device 1000. In addition, the display 1600 may also be utilized in voice communications mode, for example to display the identity of a calling party, the duration of a voice call, or other voice call related information.

The short-range communications subsystem enables communication between the mobile device 1000 and other proximate systems or devices, which need not necessarily be similar devices. For example, the short-range communications subsystem may include an infrared device and associated circuits and components, a Bluetooth™ communications module to provide for communication with similarly-enabled systems and devices, or a near field communications (NFC) sensor for communicating with a NFC device or NFC tag via NFC communications.

Many modifications and other embodiments will come to the mind of one skilled in the art having the benefit of the teachings presented in the foregoing descriptions and the associated drawings. Therefore, it is understood that various modifications and embodiments are intended to be included within the scope of the appended claims.

That which is claimed is:

1. A mobile wireless communications device comprising:
   a portable housing;
   a supply modulator carried by said portable housing and comprising
      an output node,
      a linear amplifier coupled to said output node, and
      a switching amplifier also coupled to said output node and comprising
         at least one sensing transistor configured to sense current output from said linear amplifier and generate a drive voltage, and
         a hysteretic comparator coupled to said at least one sensing transistor and configured to be driven by the drive voltage;
   a radio frequency (RF) power amplifier coupled to said output node of said supply modulator; and
   a wireless transceiver carried by said portable housing and coupled to said RF power amplifier.

2. The mobile wireless communications device of claim 1, wherein said switching amplifier further comprises at least one current conveyor circuit coupled to said at least one sensing transistor and configured to control a bias of said at least one sensing transistor.

3. The mobile wireless communications device of claim 1, wherein said linear amplifier comprises an operational transconductance amplifier and at least one transistor coupled thereto.

4. The mobile wireless communications device of claim 1, wherein said switching amplifier further comprises a buffer coupled between said hysteretic comparator and said output node.

5. The mobile wireless communications device of claim 4, wherein said buffer comprises a pair of transistors having respective control terminals coupled to each other.

6. The mobile wireless communications device of claim 4, wherein said switching amplifier further comprises at least one inductor coupled between said output node and said buffer.

7. The mobile wireless communications device of claim 1, wherein said wireless transceiver comprises a cellular transceiver.

8. A supply modulator to be carried by a portable housing of a mobile wireless communications device comprising a radio frequency (RF) power amplifier and a wireless transceiver carried by the portable housing and coupled to the RF power amplifier, the supply modulator comprising:
   an output node coupled to be coupled to the RF power amplifier;
   a linear amplifier coupled to said output node; and
   a switching amplifier also coupled to said output node and comprising
      at least one sensing transistor configured to sense current output from said linear amplifier and generate a drive voltage, and
      a hysteretic comparator coupled to said at least one sensing transistor and configured to be driven by the drive voltage.

9. The supply modulator of claim 8, wherein said switching amplifier further comprises at least one current conveyor circuit coupled to said at least one sensing transistor and configured to control a bias of said at least one sensing transistor.

10. The supply modulator of claim 8, wherein said linear amplifier comprises an operational transconductance amplifier and at least one transistor coupled thereto.

11. The supply modulator of claim 8, wherein said switching amplifier further comprises a buffer coupled between said hysteretic comparator and said output node.

12. The supply modulator of claim 11, wherein said buffer comprises a pair of transistors having respective control terminals coupled to each other.

13. The supply modulator of claim 11, wherein said switching amplifier further comprises at least one inductor coupled between said output node and said buffer.

14. A method of operating a supply modulator for a power amplifier of a mobile wireless communications device, the supply modulator comprising an output node, a linear amplifier coupled to the output node, and a switching amplifier coupled to the linear amplifier, method comprising:
   using the switching amplifier to
      sense current output from the linear amplifier via at least one sensing transistor,
      generate a drive voltage via the at least one sensing transistor, and
      drive a hysteretic comparator coupled to the at least one sensing transistor with the drive voltage.

15. The method of claim 14, wherein the switching amplifier further comprises at least one current conveyor circuit coupled to the at least one sensing transistor; and wherein the switching amplifier is used to control a bias of the at least one sensing transistor.

16. The method of claim 14, wherein the switching amplifier further comprises a buffer coupled between the hysteretic comparator and the output node.

17. The method of claim 16, wherein the buffer comprises a pair of transistors having respective control terminals coupled to each other.

18. The method of claim 16, wherein the switching amplifier further comprises at least one inductor coupled between the output node and the buffer.

* * * * *